(12) United States Patent
Stewart et al.

(10) Patent No.: US 6,377,629 B1
(45) Date of Patent: Apr. 23, 2002

(54) TWISTED PAIR COMMUNICATIONS LINE SYSTEM

(75) Inventors: Winston J. Stewart, Decatur; Philip M. Kirshtein, New Market; Steven F. Brown, Huntsville; Robert R. Asprey, Harvest, all of AL (US)

(73) Assignee: Cybex Computer Products Corporation, Huntsville, AL (US)

( * ) Notice: Subject to any disclaimer, the term of this patent is extended or adjusted under 35 U.S.C. 154(b) by 0 days.

(21) Appl. No.: 09/294,591

(22) Filed: Apr. 20, 1999

Related U.S. Application Data

(63) Continuation-in-part of application No. 08/744,629, filed on Nov. 6, 1996, now Pat. No. 5,926,509, which is a continuation-in-part of application No. 08/741,697, filed on Oct. 31, 1996, now Pat. No. 6,150,997, which is a continuation-in-part of application No. 08/219,979, filed on Mar. 29, 1994, now Pat. No. 5,576,723, and a continuation-in-part of application No. 08/660,076, filed on Jun. 3, 1996, which is a continuation-in-part of application No. 08/177,442, filed on Jan. 5, 1994, now abandoned.

(60) Provisional application No. 60/010,741, filed on Jan. 29, 1996.

(51) Int. Cl.[7] .............................. G06F 3/00; G06F 13/00
(52) U.S. Cl. ........................ 375/257; 375/219; 348/613
(58) Field of Search .................................. 375/219, 220, 375/257, 288, 317, 377; 348/192, 193, 518, 519, 608, 613, 723, 724, 725; 359/133, 173

(56) References Cited

U.S. PATENT DOCUMENTS

| | | | | |
|---|---|---|---|---|
| 4,885,718 A | * | 12/1989 | Asprey et al. | 395/281 |
| 4,947,406 A | * | 8/1990 | Yokoyama | 375/220 |
| 5,081,646 A | * | 1/1992 | Faunce | 375/214 |
| 5,193,200 A | * | 3/1993 | Asprey et al. | 345/168 |
| 5,299,306 A | * | 3/1994 | Asprey | 375/257 |
| 5,353,409 A | * | 10/1994 | Asprey et al. | 375/396 |
| 5,499,269 A | * | 3/1996 | Yoshino | 375/257 |
| 5,553,097 A | * | 9/1996 | Dagher | 375/340 |

* cited by examiner

Primary Examiner—Young T. Tse
(74) Attorney, Agent, or Firm—Nixon & Vanderhye P.C.

(57) ABSTRACT

A transmission system for transmitting analog color video signals wherein a cable comprising multiple twisted pairs is employed, and certain of these pairs are coupled to carry selected color signals as a function of the delay provided by particular twist rates. In certain instances, selected signal delay devices are connected in circuit with certain twisted pairs. By such an arrangement, it has been found that relatively long distances between a computer and monitor may be spanned by relatively low-cost, twisted pair cable commonly used for telephone communications.

9 Claims, 7 Drawing Sheets

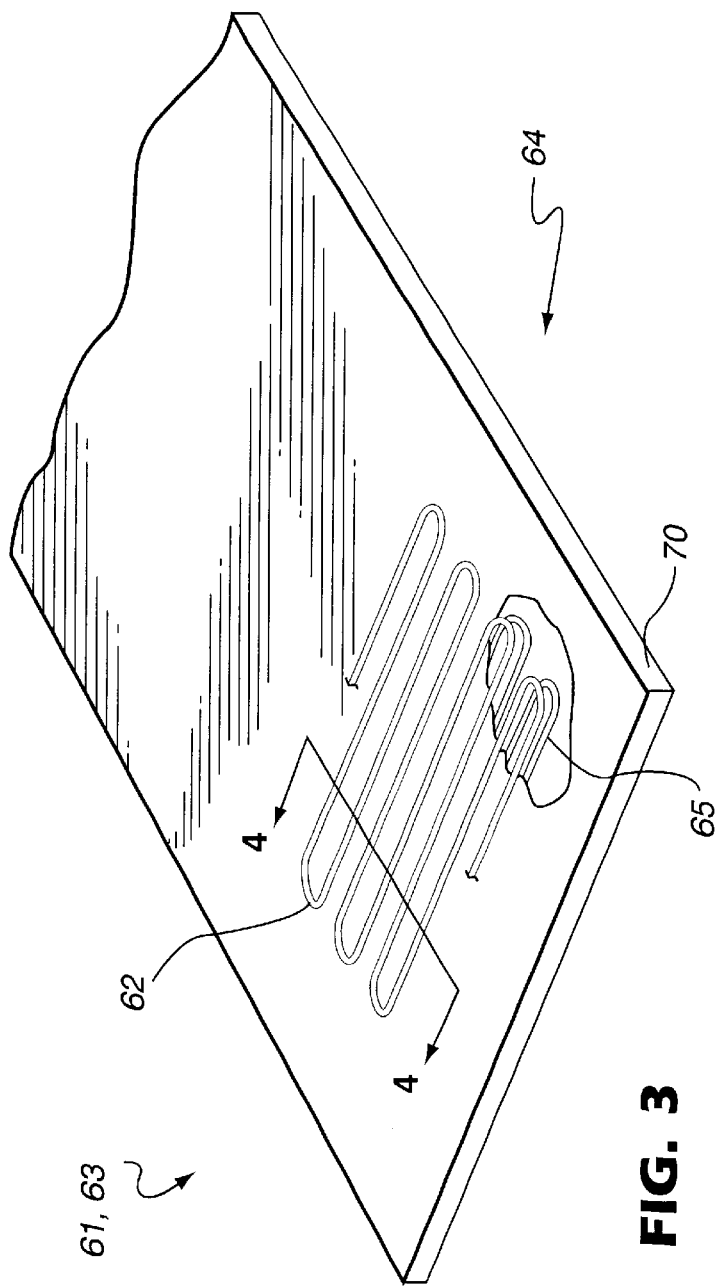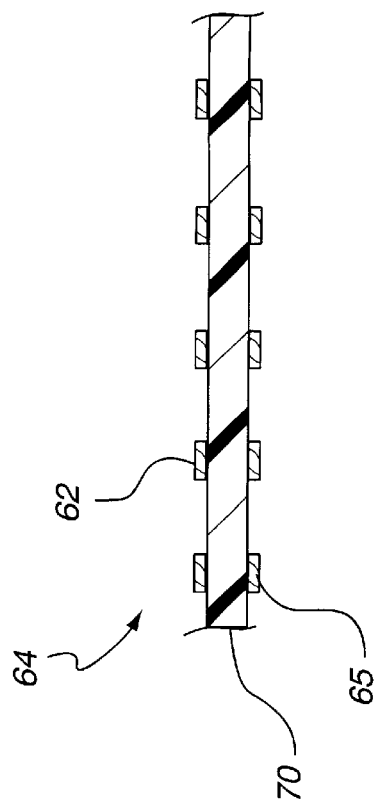
FIG. 3
FIG. 4

TWISTED PAIR COMMUNICATIONS LINE SYSTEM

CROSS REFERENCE OF RELATED APPLICATIONS

This application is a continuation-in-part of patent application Ser. No. 08/744,629, filed Nov. 6, 1996, now U.S. Pat. No. 5,926,509, which is a continuation-in-part of patent application Ser. No. 08/741,697, filed Oct. 31, 1996 U.S. Pat. No. 6,150,997, which is a continuation-in-part of application Ser. No. 08/219,979, filed Mar. 29, 1994, now U.S. Pat. No. 5,576,723. Application Ser. No. 08/744,629 also claims the benefit of provisional application No. 60/010,741, filed Jan. 29, 1996. The instant application is also a continuation-in-part of application Ser. No. 08/660,076, filed Jun. 3, 1996 which is a continuation-in-part of application Ser. No. 08/177,442, filed Jan. 5, 1994, now abandoned.

FIELD OF THE INVENTION

This invention relates generally to the transmission of wideband signals over relatively cheap, low-grade cable.

BACKGROUND OF THE INVENTION

It is now commonplace to locate computers, keyboards, and monitors, particularly color monitors, at spaced locations in a building or buildings. These locations often are several hundred feet apart, requiring that where analog color signals are involved that there must be transmitted three separate color signals, each having an approximate frequency range from D.C. up to 200 MHz. Thus, there is a requirement that appropriate transmission lines be in place, or be installed, to accommodate such transmissions. As is well know, either fiber optic or multiple coaxial cables may normally be employed, but such is often not available. Thus, there may be required by an occupant of a building that appropriate signal conductors be after fitted to the building. This can result in a considerable cost. Ideally, there would be present, or there might be installed at a relatively low cost, lower-grade conductors, such as network cable or twisted pair cable and that it be somehow used.

In a co-pending application, application Ser. No. 08/177,442, the existing cable was of the digital network type, for example, having 15 conductors within an outer shield and designed to carry on the order of 2,400 baud rate signals and wherein there existed straight (untwisted) conductors.

The problem in that case was to overcome frequency deficiencies and to overcome interaction between colors as finally received. The solution was that of discovering appropriate frequency-amplitude compensation plus effecting a phase reversal of one color signal appearing on one conductor (with respect to shield) and positioning this conductor between conductors carrying the other two color signals. At the receiver, the phase reversal was reversed back.

The present invention deals with a second type of cable, basically telephone (voice frequency) cable wherein there is included a plurality of twisted pair-type conductors, typically four pairs for the carrying of as many communications.

It too has unique problems with respect to frequency compensation. A second problem appears from the finding that different sets of twisted pairs, and in different cables, have a variety of twist rates, different twist rates for a given cable being provided to prevent telephone crosstalk between communications on different twisted pairs of a cable. Unfortunately, the applicants have found that the latter was a culprit in preventing good color signal transmissions since a composite of three color signals, sent on separate twisted pairs, is required, and the different twist rates of conductor pairs caused the lengths of the pairs and signal delays to differ. This in turn resulted in the receipt of a composite of color signals with observable impurities and thus an unsatisfactory presentation on a color monitor.

Significant, however, was the substantial availability of such cable and that it is already installed in many buildings where color transmissions were now needed. Thus, if it could be employed, such would enable a tremendous saving, a mark of clear technical achievement in view of the fact that the problem has remained unsolved for at least 10 years.

SUMMARY OF THE INVENTION

The applicants have discovered that relatively high frequency color video signals may be transmitted with high color purity over a cable having multiple, relatively low frequency, twisted pair telephone lines and despite their having different twist rates, which rates are non-uniform as between cable manufacturers. The applicants have solved the problem by effecting certain selected frequency compensation to color signals at each end of a cable and by discretely applying delays to the two twisted pair lines having lower twist rates. Alternately, in certain instances, applicants have discovered that adequate color purity can be achievable over cable runs of 300 feet or less by connecting the red video signals to the twisted pairs having the smallest twist rate (i.e., lowest twist rate), the green video signals to the twisted pair having the next highest twist rate, and the blue video signals through the twisted pair having the third largest twist rate. Typically, then, the synchronization signals would be connected through the cable having the largest twist rate (or tightest twist rate), which is not as critical.

BRIEF DESCRIPTION OF THE DRAWINGS

FIG. 2 is a schematic illustration of a portion of circuitry shown in block form in FIG. 1a.

FIG. 3 is a pictorial view, partially broken away, of a delay line assembly employable in applicants' system.

FIG. 4 is a sectional view as seen along line 4—4 of FIG. 3.

DESCRIPTION OF THE PREFERRED EMBODIMENT

Figure 1:
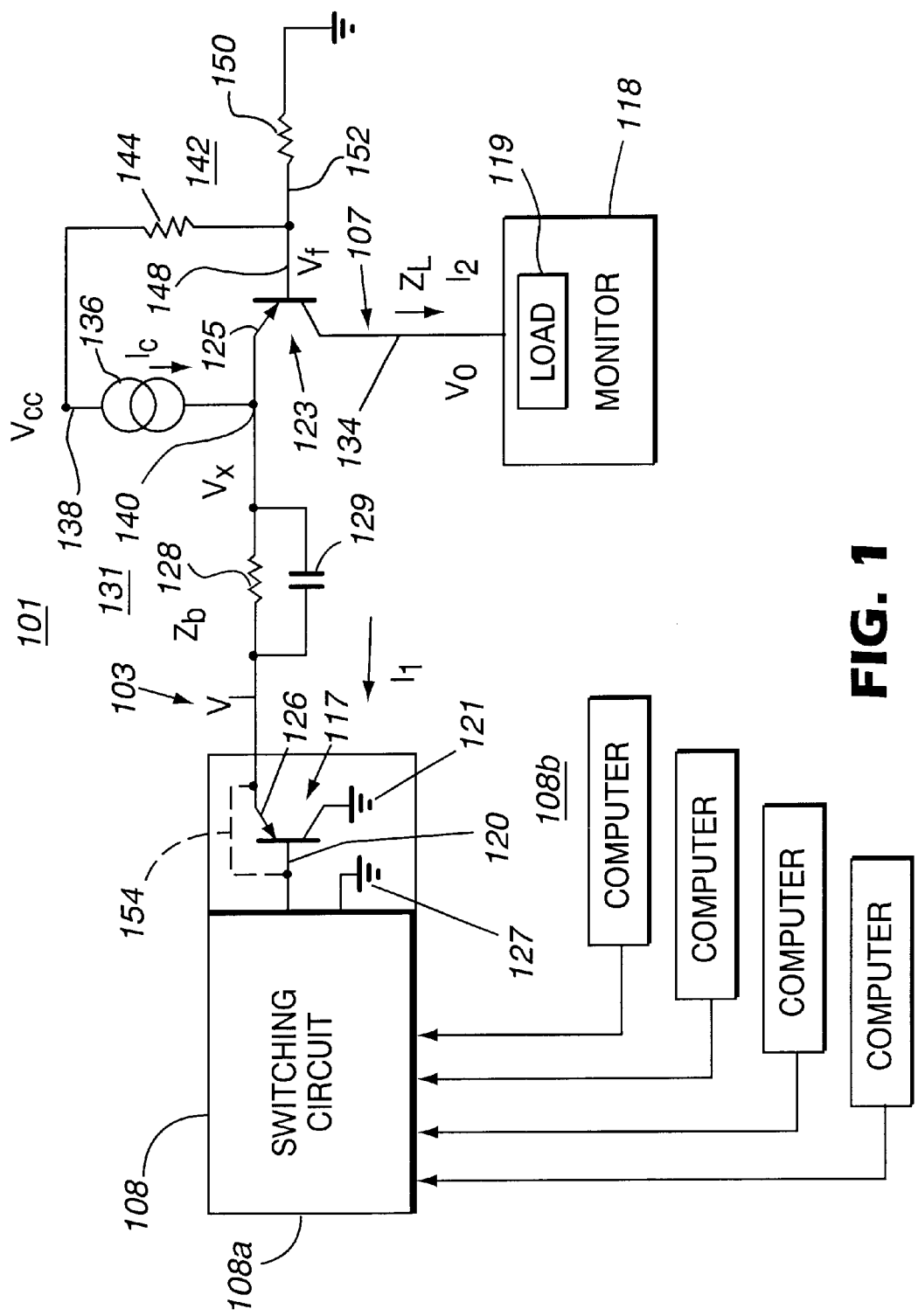
FIG. 1 is a combination schematic/block diagram of an input amplifier configuration.

Referring initially to FIG. 1, a non-inverting, constant current amplifier 101 is shown having an input region 103 and an output region 107. Input region 103 is particularly coupled to source 108 of degraded analog video signals, such as found in the assignee's Commander™ module, with resultant lowered amplitude and attenuation of high frequency components of the signal, as shown in FIG. 1 as being derived from a computer switched by switching circuit 108*a* from a particular computer of computers 108*b*. In this embodiment wherein the Commander™ module is used, an output analog video signal is provided by an emitter 126 of a PNP transistor 117 in the Commander™ module. Output region 107 of amplifier 101 is coupled to a load having known characteristics, such as an analog video monitor 118 or other analog device, with amplifier 101 providing a non-inverted, amplified representation of the input signal across the load. Where the output is coupled to a conventional analog VGA computer monitor 118, the monitor represents a load 119, which may be a resistor of about 75 ohms, with the output signal from region 107 across this 75 ohm load being about 700 millivolts. In this instance, it is to be appreciated that there would be a discrete circuitry 101 for each of the discrete video signals which, in the instance of a VGA monitor, include primary red, green, and blue analog signals. While this circuitry in a preferred embodiment is to be implemented with respect to the currently manufactured Commander™ module, it will be apparent to those skilled in the art that numerous other applications exist where non-inverting analog amplification with an enhanced output is required or desired.

Network 131, an impedance including a capacitive reactance, as will be described, is coupled from the input emitter 126 of transistor 117 to the emitter of transistor 123. Generally, in the Commander™ module, PNP transistor 117 is coupled in emitter-follower configuration and connected to network 131, with a base 120 of transistor 117 being coupled to a relatively weak analog video input signal. As such, collector 121 of transistor 117 is coupled to ground, providing an alternate current path to ground for the video signal. Resistor 128 of network 131 has a value of about 20 ohms, and capacitor 129 has a value of about 220 pF, network 131 serving to divert current in a direct relationship from the load impedance responsive to positive voltage excursions of the input signal applied to base 120. Impedance Network 131 may be fixed to provide a generally fixed gain amplifier or one which can provide variable gains and in selected frequency ranges, the impedance including capacitive reactance and this reactance is coupled as shown between emitter 126 and emitter 125 of transistors 117 and 123. It is chosen to approximately equal the combined reactance effects of transistors 127 and 123 and a cable connected to load 119. Collector 134 of transistor 123, as an example, is coupled across a load impedance 119 to the input of a conductor of a communications cable. As an example, for transistors 117 and 123, one may employ a transistor 2N2907a or equivalent, which is characterized by having a typical current gain of about 200 and is further able to maintain constant emitter voltage for a given base voltage. Typically, several reactance sets of RC may be employed, the choice being as to number and value for particular frequency ranges to be high frequency boosted, which in turn is a function of transistor effects of transistors 117 and 123 and the length of a cable.

A constant current source 136, which may be a conventional one, such as a fixed bias transistor, coupled to a stable voltage source, e.g., 4.5 volts, is coupled to terminal 140 between network 131 and emitter 119 and provides a current limited source of about 9.33 milliamps to be divided between network 131 and transistor 123. A voltage divider circuit 142 includes a resistor 144 coupled at one end to the 4.5-volt voltage source at terminal 138 and at an opposite end to terminal 152, also coupled to base 148 of transistor 123. A second resistor 150 is coupled at one end to a ground potential and at an opposite end to junction 152, with values of resistors 144 and 150 selected to provide a potential to base 148 of transistor 123 no lower than a highest anticipated peak input potential of the analog signal at the base of transistor 117, including any D.C., offset that may be present.

In the Commander™ module, it has been found that the analog video signal may be degraded to about 450 millivolts with a positive 150-millivolt D.C. offset. Thus, values of resistors 144 and 150 are selected to provide about 650 millivolts to terminal 152. With the described voltages applied to transistor 123, a lowest input signal at the input diverts current flow from transistor 123 to flow through resistor 128, reducing current flow through transistor 123 and the voltage at terminal 138 to a point where transistor 123 is biased in its operating range just above its cutoff point. As the input signal increases, current flow through resistor 128 decreases, slightly increasing a voltage level at terminal 140, biasing transistor 123 to a more conductive state and resulting in more current flow through transistor 123 and in turn increasing potential 107, for example, monitor 118, in direct relation with the input signal.

In the instance where the signal from source 108 is of lowered amplitude and is attenuated, but possesses sufficient current sourcing capabilities to drive network 131, the analog input signal is the input signal coupled directly to network 131, as represented by dashed line 154. In this configuration, resistors 144 and 150 are selected to provide a voltage at terminal 152 of about 650 millivolts below a highest anticipated peak input potential of the analog signal in order to compensate for elimination of the diode drop of transistor 117. Additionally, an output driver of routing circuit 108 would also be conventionally configured to provide an alternate current path to ground, as illustrated by ground 126. In this instance, when the input signal is at a lower state, current flows from current source 36 through network 131 to ground 127.

While the specific example described above which includes transistor 117 is an application tailored for the Commander™ module wherein the load is resistive in nature, a more generalized representation of the instant invention without transistor 117 may be illustrated where both load and bypass impedances are complex impedances. Theoretically, and assuming a transistor has a high current gain for transistor 123, the impedance of network 131 may be represented as $Z_b$, with the analog signal source voltage represented by $V_i$, which in this instance, is coupled directly to load 119 (dashed line 154), and the highest excursion of the analog signal defined by $V_x$. Current through impedance $Z_b$, is represented as $I_i$. The voltage applied to base 148 is represented as $V_f = V_x \text{peak} - 0.650$, and, as stated, is selected to be no lower than the highest peak amplitude of the input signal $V_x$ minus the approximately 650-millivolt diode drop of the emitter-base junction of transistor 123. With such voltages applied to transistor 123, the voltage at junction 140 only fluctuates slightly due to the fixed base voltage and the forward biased emitter-base junction of transistor 123, with this slight fluctuation being sufficient to directly vary conductivity of transistor 123 and resultant current flow therethrough with respect to the input signal. This generally constant voltage at junction 140 is represented by $V_x$ (max peak amplitude), with $I_c$ being current from constant current supply 136. The load is represented by $Z_L$, a complex impedance, with current flow through the load represented as $I_2$ and voltage across load $Z_L$ represented as $V_o$. With such designations, voltage across the load is defined by:

$$V_o = I_2 \times Z_L$$

and the constant current into junction 140 is a sum of the output currents, or:

$$I_c = I_1 + I_2$$

The deflected current through impedance $Z_b$ is defined by:

$$I_c = V_x - V_i/Z_b$$

with the inversely proportional flow of current through load $Z_L$ defined by:

$$I_2 x - I_c - I_i = I_c - V_x - V_i/Z_b$$

and the voltage across the load defined by:

$$V_o = Z_L I_2 = (I_2 V_x - V/Z_b) \times Z_L$$

For a change of input voltage $V_i$, $$VP_o = (I_c - V_x - V_i/Z_b) \times Z_L = (0 - (0 - V_i)/Z_b) \times Z_L$$

which, when resolved, becomes:

$$V_o = V_i/Z_b \times Z_i$$

yielding an A.C. gain of:

$$V_o/V_i = Z_L/Z_b$$

Thus, it is seen that gain of the amplifier is strictly controlled by load impedance and impedance between the emitters. In the specific example given for the Commander™ module, impedance of load $Z_b$, is about 75 ohms resistive, the magnitude of impedance of network 131 at a D.C. potential is about 20 ohms, and at 30 mHz, is about 0.6 ohms, as given by the generalized circuit analysis in the foregoing and familiar to anyone skilled in the art. Therefore, it is demonstrated that the above-described amplifier of the preferred embodiment possesses frequency sensitive gain which varies from a gain of about 75/20–3.75 ($Z_L$ divided by $Z_b$,) at a D.C. level and a gain of about 75/0.6=125 at 30 mHz. For the various embodiments illustrated and described hereinafter, the coupling impedance is first determined and gain calculated by dividing load impedance by the coupling impedance.

In operation, and referring to FIG. 1, a degraded analog video signal voltage referenced to ground from the Commander™ module taken from one of a plurality of computers C (only one shown) and intended to be applied to an analog computer monitor is applied to base 120 of transistor 117. In this instance, bias voltages of transistors 117 and 123 are obtained from terminal 140, with a reference voltage of about 600 millivolts taken from terminal 138 and applied to base 148 of transistor 123. The voltage at terminal 140 is about 1.2 volts, which is a diode drop of about 650 millivolts above the reference voltage applied to base 148, and which is varied as described by transistor 117 responsive to excursions of the input signal applied to base 120. The input signal is degraded to the extent of loss of high frequencies necessary and is offset by a positive D.C. bias of about 150 millivolts due to switching levels in the Commander™ module and degraded in amplitude to have a swing of about 450 millivolts between about 150 millivolts and 600 millivolts. This signal, when at the 150-millivolt level and applied to base 120 of transistor 117, biases transistor 117 on, deflecting virtually all the 9.33 milliamps from current source 136 through 20-ohm resistor 128 due to the difference of voltage potentials on either side of resistor 128, with this current being applied to ground via transistor 117. This depletes current flow through transistor 123 and reduces voltage at terminal 140 to just above a cutoff voltage, reducing the IR voltage drop across the monitor load to 0 volts. As the input signal applied to base 120 rises to about 600 millivolts, transistor 117 is biased toward its cutoff region; and with about 1.2 volts applied to emitter 126 from terminal 140, less current flows through network 131 due to decreasing potential difference across resistor 128. This in turn slightly increases potential at terminal 140 such that transistor 123 is biased more toward a conductive state, resulting in increasing current flow through transistor 123 to the 75-ohm load in monitor 118. As the potential across network 13 equilibrates as transistor 117 is driven toward cutoff, the entire 9.33 milliamps from constant current source 136 is shifted to flow through transistor 123 and the 75-ohm monitor load, increasing the potential across the 75-ohm load to about 700 millivolts, a conventional level for an analog monitor.

As described, as the input signal fluctuates between low and high levels, the constant current is divided and fluctuates with the input-signal between transistors 117 and 123. In the absence of transistor 117, an analog video signal extending from about 150 millivolts or lower to about 600 millivolts is applied to network 131, and when at the lowest level, draws a highest level of current flow through network 131, which current flow applied to ground 126 reduces potential on emitter 119 to a level to bias transistor 123 to a higher impedance, reducing output on collector 134 to 0 volts. As the signal applied to network 131 increases, less current flows through resistor 128, increasing a potential at terminal 140 and biasing transistor 123 to a more conductive state in direct relationship with the input signal, shifting current flow to the load via transistor 123 and increasing voltage drop thereacross. In the event the input signal exceeds the reference potential applied to terminal 152, as by a noise spike, biasing transistor 123 into saturation, the load is generally protected from an overvoltage condition due to the constant current source 136 providing only 9.33 milliamps current flow to the load.

Figure 1A:
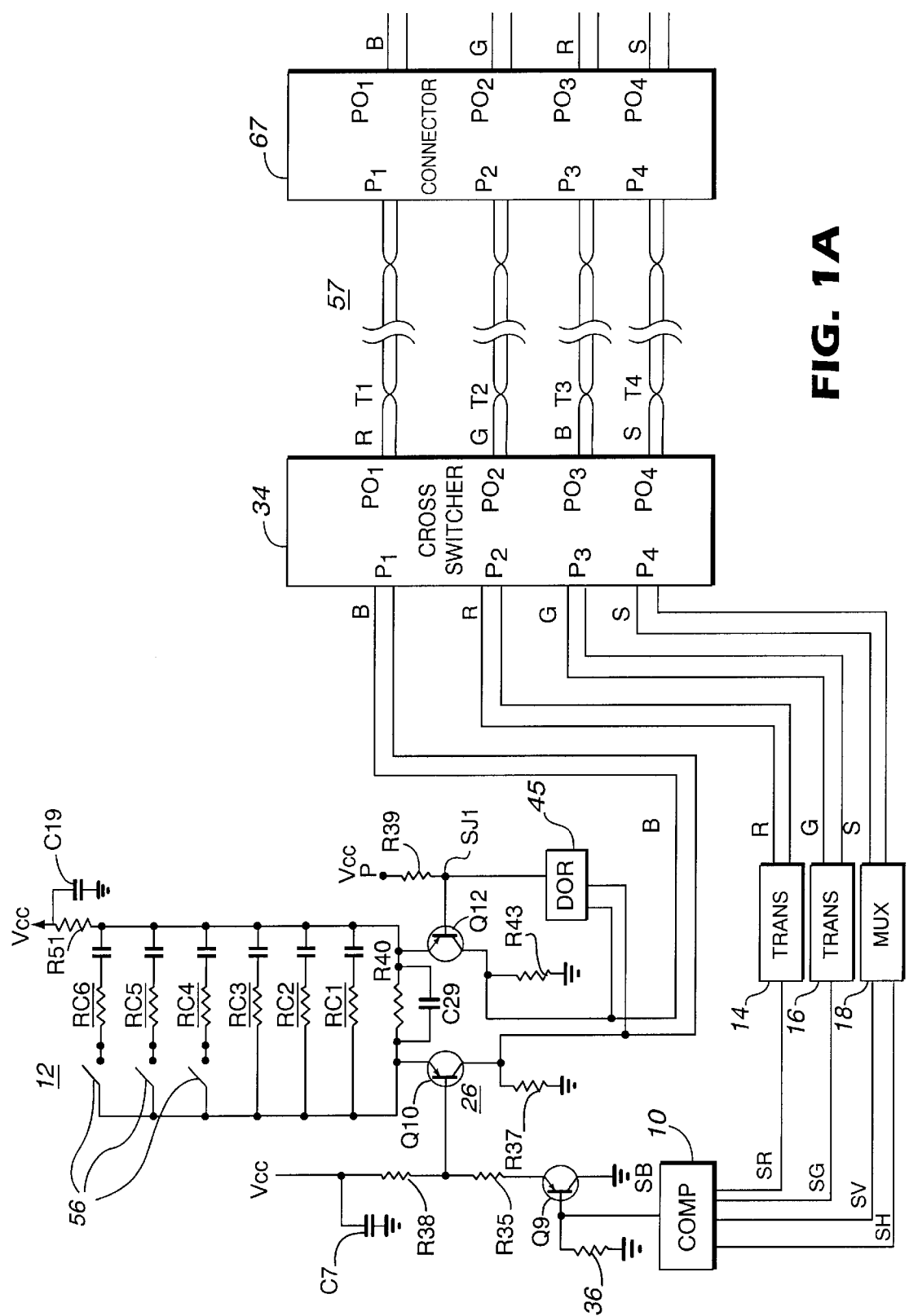
FIG. 1a is a combination block-schematic illustration of the transmitter portion of applicants' system.

Referring first to FIG. 1a, there is shown a largely schematic electrical diagram of the invention. A computer 10 provides three, blue (SB), red (SR), and green (SG), analog color signals and vertical (SV) and horizontal (SH) synchronization signals.

As shown, the three color signals are supplied to three like transmitter circuits 12, 14, and 16, one of which, circuit 12, is shown in detail. The synchronization signals SV and SH are supplied to time multiplexer 18 which conventionally time multiplexes these signals and provides a combined output signal S to an input of cross-switcher 34.

Referring first to transmitter circuit 12, the input signal SB, the blue video signal, is supplied by computer 10 to transmitter 12. Signal SB and the other color outputs of computer 10 each typically vary over a range from 0 to 750 mv, and need frequency response up to about 200 MHz.

Referring to FIG. 1a, transistor Q9 receives on its base an SB signal, across resistor 36 from computer 10, and basically serves as a buffer, providing, from its emitter, an input through resistor R35 to the base of transistor Q10 of differential amplifier 26. The emitter of transistor Q9 is D.C. biased through resistors R35 and R38 from a five-volt+ terminal, designated $V_{CC}$ throughout FIGS. 1a and 1b. The base of transistor Q10 is biased through resistor R38, and capacitor C7 provides a decoupling effect across the $V_{CC}$ terminal. The collector of transistor Q9 is connected to ground.

Transistors Q10 and Q12 are coupled, as will be described, as a differential amplifier 26 providing high frequency boost. The emitter of transistor Q10 is biased through resistors R40 and R51 from the $V_{CC}$, and the $V_{CC}$ is decoupled at resister R51 by capacitor C19. The emitters of transistors Q10 and Q12 are connected by resistor R40 and by a series of RC high frequency boost filter circuits, as will be discussed below. The emitter of transistor Q12 is D.C. biased from the $V_{CC}$ through resistor R51.

The base of transistor Q12 is biased through resistor R39 from the $V_{CC}$ as effected by the load manifested at junction SJ1. A portion of this load is manifested from D.C. restorer 45 as driven by differential amplifier 26, shown in greater detail in FIG. 2. The net effect of this is a closed loop feedback that receives the voltage appearing at the base input of transistor Q12 which, of course, varies. This in turn varies the total current feeding the amplifier through resistor R51, and the balance of current is split between transistors Q10 and Q12 to maintain truly balanced outputs.

It is to be noted that this balanced output of differential amplifier 26 appears across the combination of transistor Q10 collector resistor R37 and transistor Q12 collector resistor R43.

As suggested above, and significantly, differential amplifier 26 provides several stages of high frequency boost as shown by RC circuits RC1–RC6 and C29, connected between the emitters of transistors Q10 and Q12.

The emitters of transistors Q10 and Q12 are also coupled by resistor R40, which is of a value of approximately 118 ohms and acts as the D.C. gain of the circuit.

High frequency boost stages RC1, RC2, and RC3, each consisting of a resistor and a capacitor in series, and each have a discrete time constant accomplished by sizing of the capacitor of the stage to achieve a high frequency boost for different portions of the spectrum of interest from 0 to 200 MHz.

Figure 1B:
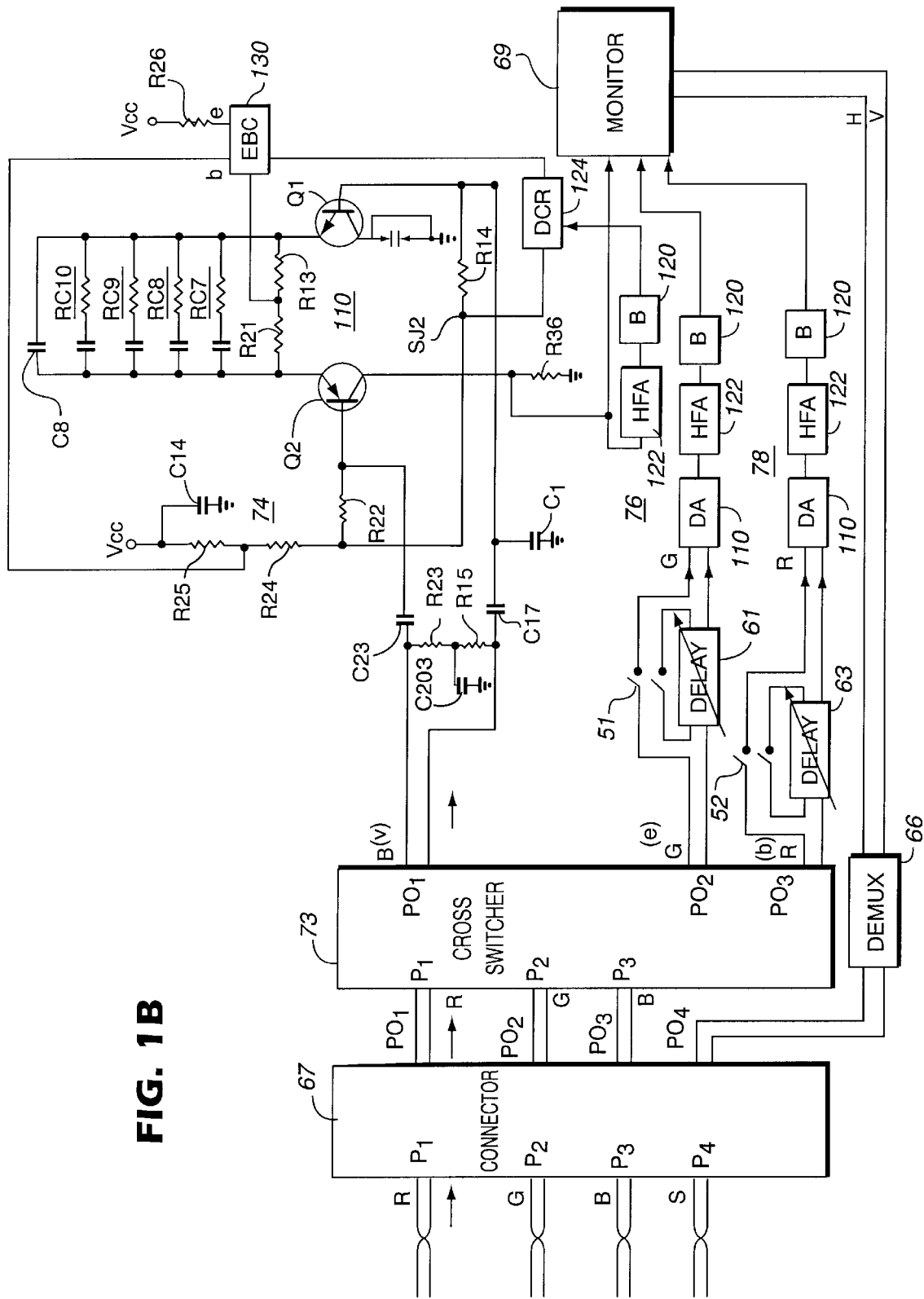
FIG. 1b is a combination block-schematic diagram of the receiver portion of applicants' system.

In addition, there are provided three selectable high frequency boost stages, RC4, RC5, and RC6, each of which is switched in or out by a switch 56 shown in the open position. In operation, one or more of these switches would be closed as deemed necessary as a direct function of the length of cable to be used and as a function of the condition of the twisted pairs employed. Thus, RC4, RC5, and RC6 would additively be inserted as it appeared necessary to achieve the desired degree of signal purity at monitor 69 (FIG. 1b).

Figure 2:
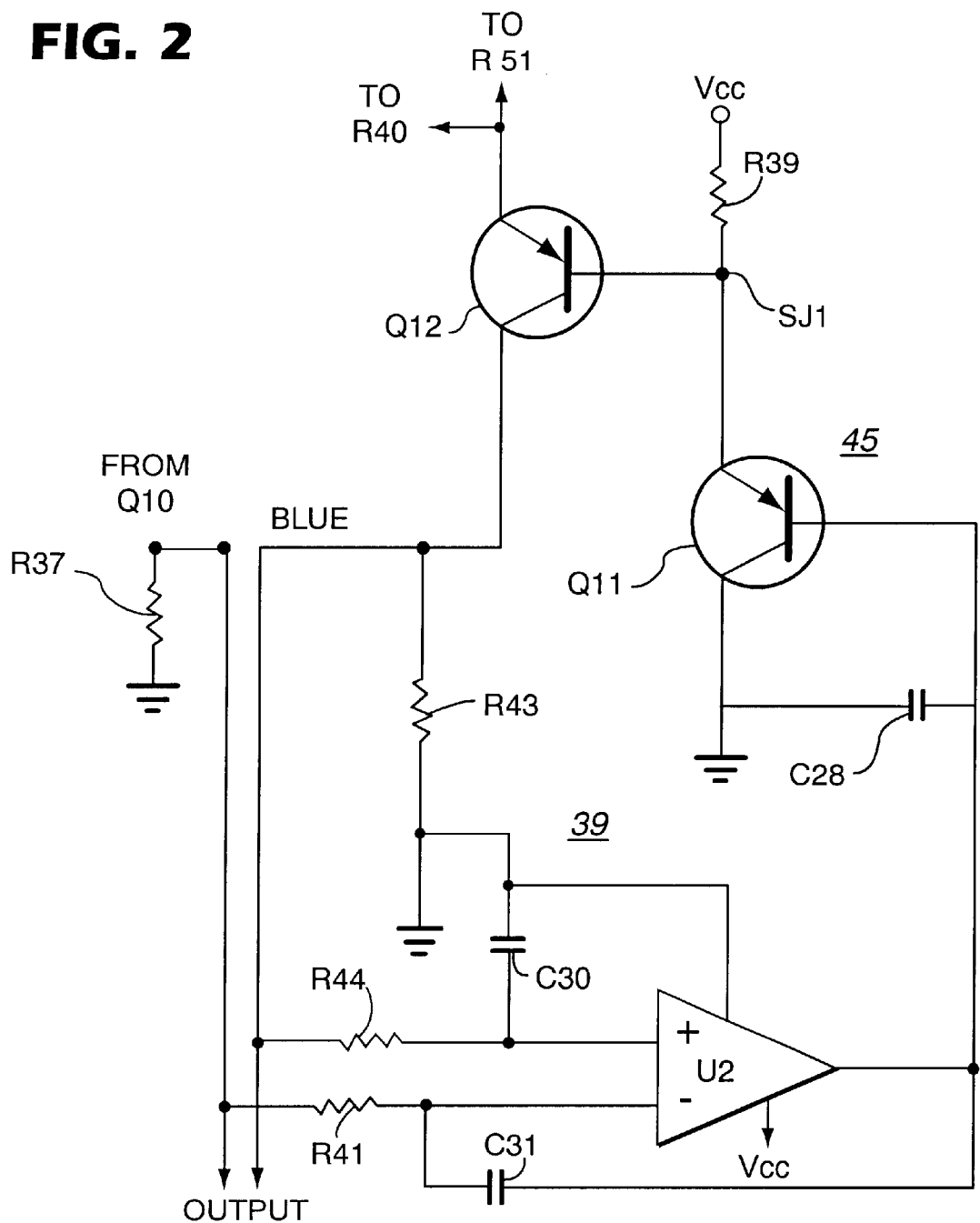

As shown in FIG. 2, a sample of the output of differential amplifier 26, taken across collector-resistors R37 and R43, is fed to operational amplifier U2 through resistors R41 and R44. A negative feedback path is provided by capacitor C31 from the output of operational amplifier U2 to its inverting input.

The output of operational amplifier U2 is fed to the base input of transistor Q11, there being capacitor C28 connected between the base of it and ground, which capacitor is sized, e.g., 22 $\mu$F to 100 $\mu$F to stabilize the base voltage of transistor Q11. The emitter of transistor Q11 is connected to the base of transistor Q12 at summing junction SJ1, and the collector of transistor Q11 is grounded. As one function of transistor Q11, transistor Q12 receives a base voltage raised by a diode drop through transistor Q11, a like raise as provided by transistor Q9 to transistor Q10 (FIG. 1a), to basically balance the D.C. levels of the two. In this respect, transistor Q11 functions as a part of D.C. restorer 45 and functions for the purpose of stabilization as well as providing an offset voltage to the base of transistor Q12 of differential amplifier 26 to match that provided by transistor Q9.

Referring back to FIG. 1a, the output of transmitter circuit 12 appears across collector-resistors R37 and R38, each connected to ground, and together providing a balanced output. These resistors each have a value of approximately 50 ohms to, together, match the rather standard impedance of 100 ohms of twisted pair telephone lines, such as T1–T4 of cable 57.

Each of transmitter circuits 14 and 16 are identical with that of transmitter circuit 12, and thus together they apply blue (B), red (R), and green (G) input signals to discrete input ports $P_1$–$P_3$ of cross-switcher 34.

Multiplexer 18 time multiplexes the vertical and horizontal signals SV and SH from computer 10, and the resulting signal is applied as an input S to a discrete port $P_4$ of cross-switcher 34. It has an output impedance of 100 ohms to match a twisted pair T4 of cable 57. Thus, in all, there are four signal inputs to cross-switcher 34.

Basically, cross-switcher 34 is configured to connect any one of its input signals at ports $P_1$–$P_4$ to any one of its output ports $PO_1$–$PO_4$, to which any particular pair of twisted pairs T1–T4 of a cable, having various arrangements of twisted pairs and twist rates, may be connected. Thus, as shown, cable 57, a common cable, has four twisted pair conductors, T1–T4, and these are connected to discrete output ports $PO_1$–$PO_4$ of cross-switcher 34. This enables the systematic employment of cable manufactured by a number of different manufacturers, with a variety of twist rates for individual twisted pairs to be selectively coupled, as will be described. Typically, all twisted pairs of a cable have twist rates which differ as between pairs, to prevent cross-talk in normal telephone usage.

Here, the magnitude of twist rate is used to designate cable pairs, this being from an examination wherein it has been found that cable pair T1 has the lowest twist rate, and cable pair T4 has the highest or largest twist rate. Applicants have determined that the connection pattern of cross-switcher 34 would be such that the S output of multiplexer 18 would be connected to a cable pair T4 of cable 57, it having the highest twist rate and thus the longest length. This follows from the determination that its twist rate and thus its inherent longest signal delay is not usually critical.

The B or blue output from transmitter circuit 12 would be connected to the twisted pair T3 having the next lower twist rate; the G or green output from transmitter circuit 16 would be connected to the next lower twist rate pair, T2. The R or red output of transmitter circuit 14 would be connected to the lowest rate cable pair T1 of cable 57 thus having the shortest overall length.

The relative twist rates of twisted pairs can be determined by a visual inspection of approximately six inches of the cable being examined, and therefrom connections would be arranged in terms of the foregoing system of connection.

The length of cable 57 would typically be in the approximate range of from 300 up to about 1,500 feet.

Referring to FIG. 1b, twisted pairs T1–T4 terminate in the order of input ports $P_1$–$P_4$ of connector 67. Connector 67 effects a connection between input ports $P_1$–$P_4$ of these cable pairs to a series of its coordinate outputs $PO_1$–$PO_4$, including those labeled simply R (red), G (green), B (blue), and S (synchronization) in this same order.

As a feature of this invention, for cables of a length of shorter than about 300 feet, the outputs would be directly connected to the same designated color inputs of receivers 74, 76, and 78 through cross-switcher 73, performing a like function to that of cross-switcher 34 as shown in parenthetically enclosed small letters. Also, as shown in FIG. 1b, this is effected by the closure of switches 51 and 52 to bypass time delay units 61 and 63. This configuration arises from the discovery that with shorter length cables (<300 feet), cable pairs may be employed with different twist rates where they carry the particular colors as shown and still provide adequate signal purity without time compensation.

Demultiplexer 66 is fed an S signal from $PO_4$ of connector 67, and this signal is then separated back into horizontal H and vertical V signals and to thus be directly applied to analog monitor 69.

For greater lengths, and as a further feature of this invention, the green and red signals are delayed. Thus, with this mode of operation, cross-switcher 73 is adjusted such that input $P_1$, the red input, is connected to either the $PO_2$ or $PO_3$ output, and the green input at $P_2$ is connected to the other of the $PO_2$ or $PO_3$ output. Input $P_3$ of cross-switcher 73, the blue input, is connected to output $PO_1$. The position of particular color outputs of the cross-switcher are shown in capital letters B, G, and R. Delays units 61 and 63 are in circuit with the red and green signals, and the delay units are adjusted to compensate for the particular added lengths of twisted pairs T2 and T3 when compared with the length of twisted pair T1. Thereby, the time of arrival of the signals at monitor 69 can be adjusted so that all three signals arrive at the same time. There is, as shown, additional signal processing by receivers 74, 76, and 78, as will be further discussed below.

Figure 5:
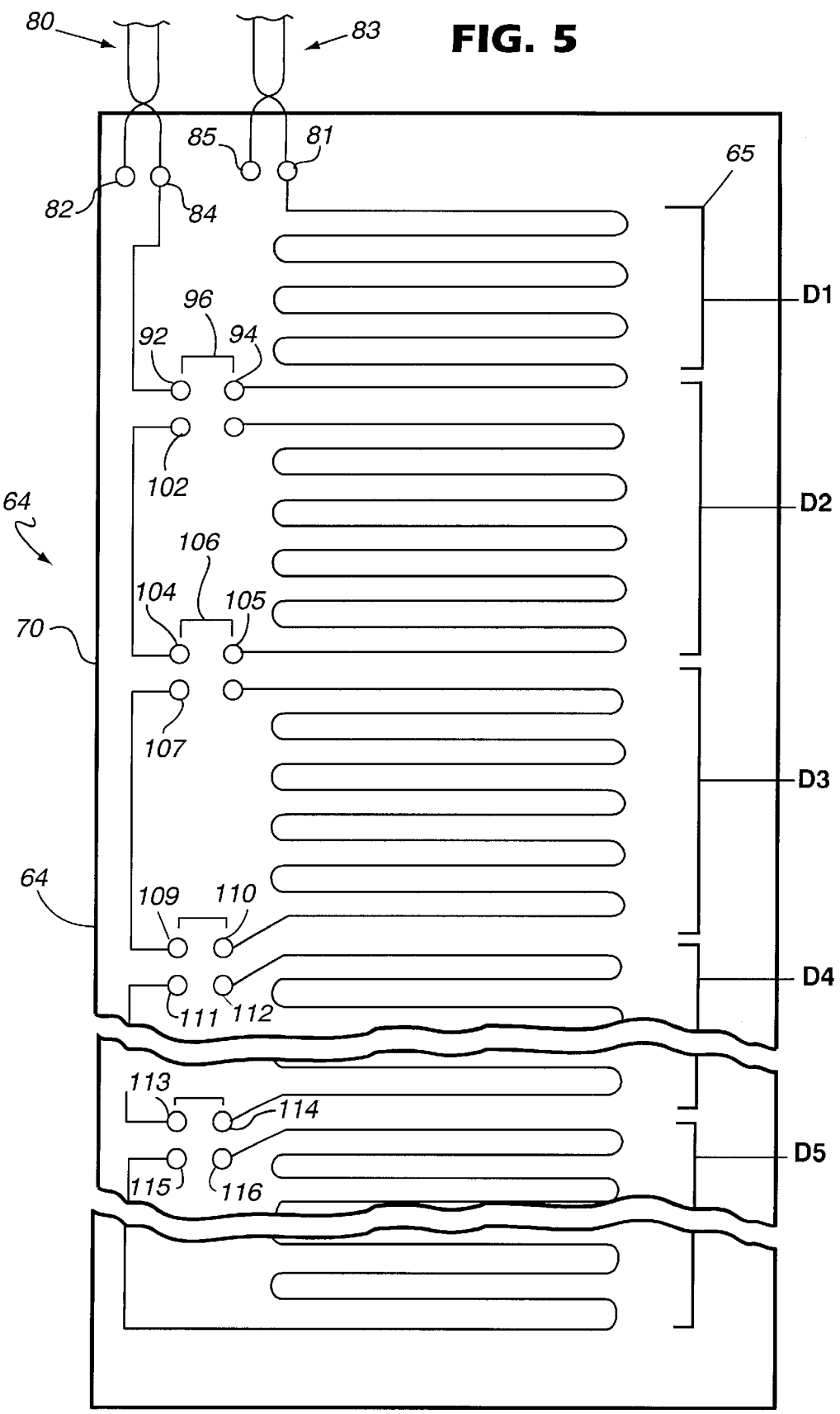
FIG. 5 is a schematic illustration of a delay line partially shown in FIGS. 3 and 4 and particularly illustrating that selected portions may be employed for selected delays.

FIGS. 3–5 illustrate the construction of one of the delay units of delay units 61 and 63 of FIG. 1b as delay unit 64. Thus, a delay unit 64 is formed with a dielectric base or insulating board 70 such as fiberglass, typically used in printed circuit boards. A printed conductor 62 is on one side, and directly opposite on the other side is printed conductor 65. Thus, with such parallel conductors separated by an insulating board 70, there is created discrete lengths of balanced transmission lines, as illustrated in FIG. 5. The thickness and material of the board determine a dielectric coefficient which basically determines the characteristic impedance of the transmission line, which in this case has been chosen with a thickness of 0.032 inch to create a transmission line having about the same propagation factor as twisted pair lines T1–T4 and with a like characteristic impedance of approximately 100 ohms, matching the usual or standard impedance of the twisted pair communications lines. The propagation factors of both the twisted pair lines and transmission line are approximately 0.69.

As shown in FIG. 5, each of the separate transmission lines D1–D5 of conductor pairs 62 and 65 are of the same length and are compressed by the serpentine arrangement to fit an approximately 4½×7-inch board 70. The conductors have a width of approximately 0.028 inch and thickness of approximately 0.0015 inch and are typically constructed of printed circuit board copper trace. The conductors have break points as illustrated in FIG. 5 wherein, in practice, the lengths of the separate delay lines, D1, D2, D3, D4, and D5, each have an actual length of approximately 65 cm to create a delay of 5 nanoseconds or a total delay of 25 nanoseconds.

Referring further to FIG. 5, an input signal to signal pair 80 of delay unit 64, as from cross-switcher 73 (FIG. 1b), connects to terminals 82 and 84, one of them, terminal 82, being attached to a conductor of pair 80 on the reverse side of board 64, and terminal 84 being connected to the other conductor of pair 80 on the top side of board 70. Similarly, a signal output line 83, to one of receivers 74 or 76, would have its conductors connected to conductor terminal 81 on the top side of board 64, and terminal 85 on the bottom side of board 70.

Circuit connections are variably made for different delays by means of straps, for example, a strap 96, on each side of board 70 would connect in circuit any number of delay units D1, D2, D3, D4, and D5. Again, only the unit conductor terminals for the one side are shown, it being understood that the same designation and pattern of terminals and straps is provided on the opposite side, and the same pattern of strapping between units would be accomplished.

Thus, in order to employ a minimum delay, utilizing delay line D1, terminals 92 and 94 would be strapped together by a strap 96, whereby, as is apparent, only delay unit D1 would be in circuit between input and output signal lines 80 and 83 for a delay of 5 nanoseconds.

If it is desired to add another 5 nanoseconds of delay, straps 96 would interconnect terminals 92 and 102, and strap 106 would interconnect terminals 104 and 105. Following the same pattern of connection, if additional delay is needed, a strap would interconnect one of terminals 109, 111, 113, or 115, with an opposite terminal of terminals 110, 112, 114, or 116, and preceding straps would be employed in the fashion illustrated to further serialize delay units D3, D4, and/or D5.

As described, and referring to FIG. 1b, two of the delay units 64, as delay units 61 and 63 (FIG. 1b), would typically be employed, one in circuit with each of twisted pairs from terminals $PO_2$ and $PO_3$ of cross-switcher 73, being the conductor pairs having the smaller of the twist rates of the three conductor pairs (for color signals), being for the green and red color signals. Thus, in the illustration, the applicants have chosen to connect via cross-switcher 73, at the far end of cable 57, the red signal R and green signal G to twisted pairs T2 and T3. The green and red signals are connected to signal delay units 61 and 63, respectively, and the blue or B signal connected directly to the $P_1$ input of cross-switcher 73. The switched delays set forth for each board 64 would be such as to compensate for the differences in lengths of twisted pairs and produce an essentially equal path for each color transmission. This may be accomplished by observing monitor 69. Alternately, the transmission lines, with appropriate input and output couplers (providing an input and output to an unbalanced line), may be unbalanced lines where in there would simply be a conductive plate on one side of board 70 and only the conductors on the opposite side are employed and are switchable.

The discrete outputs of cross-switcher 73 are connected, as shown, to the discrete balanced inputs of identical receivers 74, 76, and 78, receiver 74 being shown in detail. Examining receiver 74 (FIG. 1b), a receiver input from terminal output $PO_1$ obtains a signal appearing across resistors R15 and R23 balanced to ground through capacitor C203. The input across R15 is applied through capacitor C17 to the base input of transistor Q1, and the other input is applied across resistor R23 and through capacitor C23 to the base input of transistor Q2. These two transistors are connected and operate as a differential amplifier 110.

Figure 6:
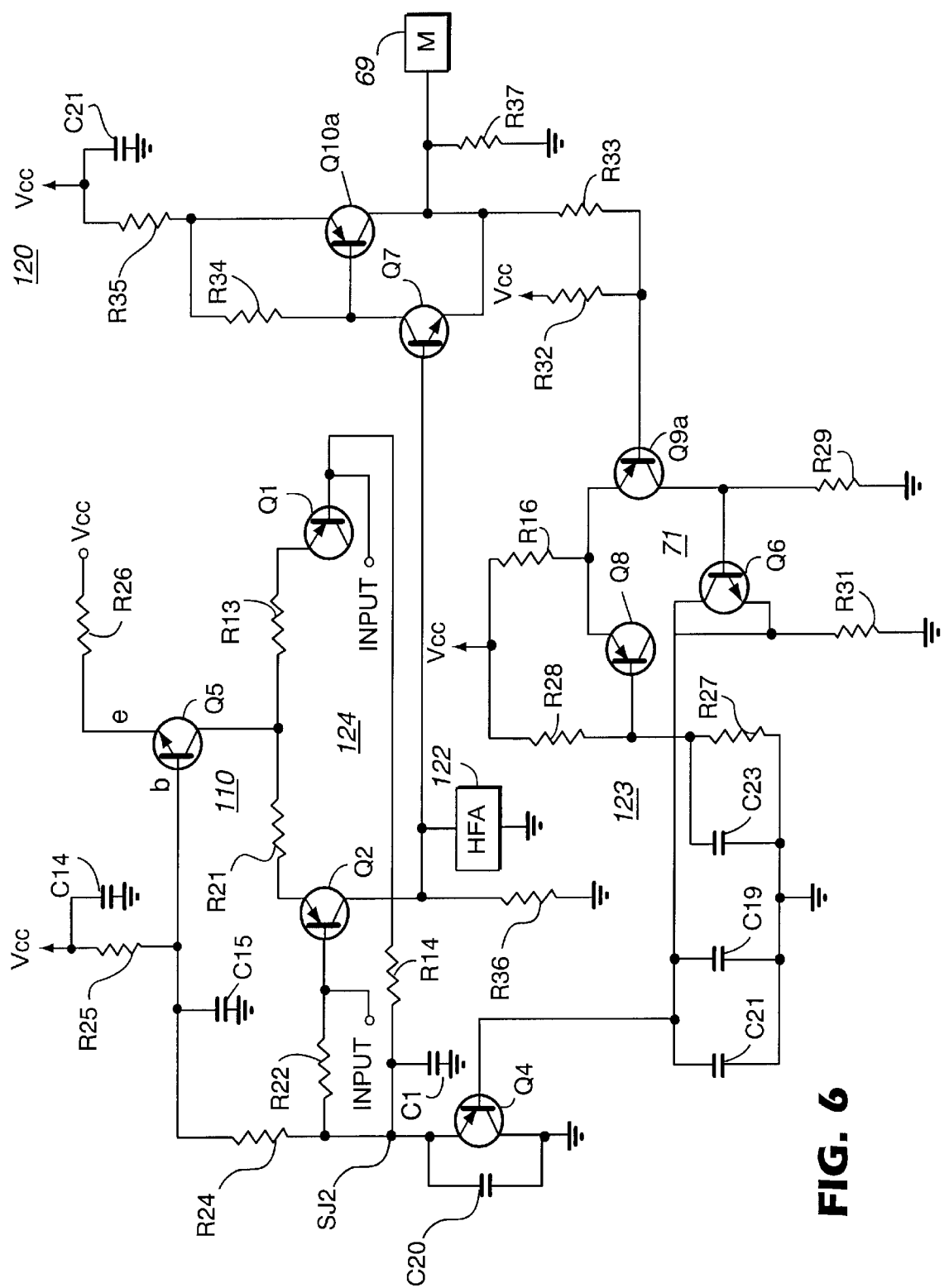
FIG. 6 is a schematic illustration of a portion of FIG. 1b shown in block form.

Referring now additionally to FIG. 6, the bases of transistors Q2 and Q1 are biased through separate paths, one being through R25, R24, and R22 to the base of transistor Q2 and through resistors R25, R24, and R14 to the base of transistor Q1. Bias is from a positive source terminal $V_{CC}$, and it is bypassed to ground through capacitor C11. The base bias to transistors Q2 and Q1 as it appears at summing junction SJ2 is also effected by the emitter voltage of transistor Q4 of buffer 120. Buffer 120 is in turn driven by the collector output of transistor Q2 taken across collector-resistor R36 and a high frequency attenuator 122, which functions to roll off excess energy on the video signal (i.e., overshoot) to enhance signal purity to monitor 69. The control of transistor Q4 is described below with respect to a further description of FIG. 6.

The emitters of transistors Q2 and Q1 are supplied current and bias control by control 130 (FIG. 1b) which employ transistor Q5 (FIG. 6) by receiving a voltage bias on its base. The emitter bias to transistors Q1 and Q2 is supplied from the collector of transistor Q5 through resistors R13 and R21, respectively, and the amplification of this current is set by the magnitude of resistor R26 and the emitter voltage of transistor Q5.

Differential amplifier 110, which is basically formed by transistors Q2 and Q1, includes a high frequency boost circuit and wherein there are four serially-connected RC circuits RC7, RC8, RC9, and RC10, each circuit connected between the emitter of transistors Q2 and Q1 and each having a time constant to deal with discrete portions of the desired frequency response boost, from D.C. to 200 MHz. Additionally, capacitor C8, also connected between the emitters of transistors Q2 and Q1, has a value of approximately 150 pF and functions to add selected high frequency boost as necessary and as a direct function of the length of transmission line.

As in this case, it is desired to obtain only a single-ended output of differential amplifier 110, a single load resistor, being R36, is connected between the collector of transistor Q2 and ground, and the collector of transistor Q1 is directly grounded. The output of differential amplifier 110, across resistor R36, is buffered through transistor Q7 (FIG. 6), and its emitter provides the blue signal to monitor 69.

As noted above, FIG. 6 separately illustrates circuitry for providing an additional biasing effect to the bases and emitters of transistors Q1 and Q2, this being present at summing junction SJ2 and effecting the emitter biasing by control of emitter bias control 130 (FIG. 1b).

Referring again more particularly to FIG. 6, a sample signal input for the circuitry is obtained across receiver output resistor R36 and high frequency attenuator 122, as discussed above, and is applied to the base input of transistor Q7 of a buffer stage including transistors Q7 and Q10 wherein the collector output of transistor Q7 is fed to the base input of transistor Q10 and the two providing, as described above, a buffer which drives monitor 69.

To effect operation, a D.C. bias is applied from a $V_{CC}$, A.C. bypassed by capacitor C21, through resistor R35 to the emitter of transistor Q10a and additionally through resistor R34 to the base of transistor Q10a and collector of transistor Q7. The output of this amplifier or buffer stage at the connected emitter of transistor Q7 and collector of transistor Q10 is fed directly to monitor 69 and through resistor R33 to the base of transistor Q9a of differential amplifier stage 71 of D.C. restoration circuit 124.

Differential amplifier 71 basically employs transistors Q9a and Q8, and the emitters are connected together and biased by a +, or $V_{CC}$ terminal through resistor R16. The base of transistor Q9a is biased through resistor R32 from a $V_{CC}$ terminal, and the base of transistor Q8 is biased through resistor R28 from the $V_{CC}$. Resistor R27, bypassed by stabilizing capacitor C23, is connected between the base of transistor Q8 and ground. The collector output of transistor Q6, appearing across capacitors C21 and C19 as stabilizing capacitors, is connected to the base input of transistor Q4. The collector of transistor Q4 is connected to ground, and a stabilizing capacitor C20 is connected between the emitter and ground, with the result that a restored D.C. voltage is applied to summing junction SJ1, at which point the conventional bias from the $V_{CC}$ and the effect of emitter-collector reaction of transistor Q4 meet, with the result that this voltage plus base currents from transistors Q1 and Q2 across resistors R14 and R22 provide D.C. bias for D.C. restoration circuit 124.

Thus, as one effect of the above, the voltage drop across resistor 25, bypassed to ground by capacitor C15 and applied to the base bias of transistor Q5, determines the amount of current supplied to differential amplifier 110 through resistors R13 and R21. Finally, a $V_{CC}$ terminal is connected through resistor R26 to the emitter of transistor Q5, and the collector of this transistor provides a current limitation characterized type bias through resistors R13 and R21, respectively, to emitters of transistors Q1 and Q2.

As a result of the base bias voltages, derived as stated, to transistors Q1 and Q2 and the emitter biases to transistors Q1 and Q2 as just described, there is effectively created a feedback system which modulates supply current to transistors Q1 and Q2 at a voltage to maintain the collector outputs of transistors Q1 and Q2 within a selected range, as at the output of transistor Q2 and across resistor R36. Accordingly, there is provided an optimum single-ended video signal for the base of transistor Q7 and an optimum output to monitor 69.

Receiver 74 thus functions to provide a high frequency boost by virtue of the RC circuits 7, 8, 9, 10, and C8 which effects A.C. gain and phase shifts at various frequencies in the frequency region up to 200 MHZ and thus to achieve a final frequency compensated signal response to monitor 69.

Referring back to FIG. 1b, the output of receiver 74, as thus boosted by the RC circuits illustrated and as attenuated by attenuator HFA 122, is buffered and then fed as a blue input to analog color monitor 69, as described.

Green and red receivers 76 and 78 are illustrated only in block form and function as receiver 74, as described above. The outputs of the receivers are provided to monitor 69, being a green signal as the output of receiver 76 and as a red signal of the output of receiver 78. With the frequency compensation and delay adjustments described above, there is provided to monitor 69 a coordinate signal wherein the interconnections and timings of the color signals are such as to provide a composite signal with excellent color quality despite the most unlikely medium of cable transmission. Again, the adjustments are simply to adjust the filter insertions and delay insertions, as described above, to effect optimum quality.

Most significantly, this invention provides a means of color communications in literally thousands of locations having twisted pair installations at low cost which otherwise could cost the users quite large sums as required to replace twisted pair telephone lines with conventional high frequency conductors.

What is claimed is:
1. A video color signal transmission system comprising:
 a plurality of sources of sets of video color signals, each set selectable for transmission and including a (R), (G), and (B) video color signal,
 a plurality of transmitters, one of each for one of each of said (R), (G) and (B) video color signals of a selected said set, each said transmitter including:
  signal balancing circuitry coupled to each said transmitter, thereby providing balanced (R), (G) and (B) video color signal outputs,
 a cross switcher in circuit with each said signal balancing circuitry, thereby providing as a set, balanced (R), (G) and (B) video color signal outputs,
 a transmission cable comprising:
  a plurality of twisted pair communications lines, each twisted pair communications line having a first end and a second end, said first end of each said twisted pair communications line coupled to said cross switcher and said second end of each said twisted pair communications line providing a balanced one of said (R), (G) and (B) video color signal outputs, with a twist rate of each of said twisted pair communications lines effecting a different signal delay, whereby any of said (R), (G) and (B) color signals of a selected set may be selectively applied to any of said plurality of twisted pair communications lines; and, a plurality of receivers for each said (R), (G) and (B) video color signal, each said receiver comprising:
  a balanced input coupled to said second end of a respective said communications line of said transmission cable,
  an amplifier and balanced to single-ended circuitry coupled to each said second end of each of said twisted pair communications lines, and
  a single-ended monitor output couplable from said balanced to single-ended circuitry.

2. A transmission system as set forth in claim 1 wherein the twist rate of at least two of said twisted pair communications lines is different.

3. A transmission system as set forth in claim 1 further comprising two signal delay circuits, one of each coupled to said second end of two of said twisted pair communications lines whereby two of said R, G, and B video color signals are delayed.

4. A transmission system as set forth in claim 3 wherein each said signal delay circuit provides a different delay to said two of said R, G, and B video color signals.

5. A transmission system as set forth in claim 3 wherein each of said signal delay circuits includes a transmission line of selectively variable lengths, and switches for selectively inserting one or more of said selectively variable lengths of said transmission line in circuit with respective said second ends of said two of said twisted pair transmission lines, providing a selection of a plurality of signal delays.

6. A transmission system as set forth in claim 1 wherein the twist rate of said twisted pair communications line carrying the (R) color signal has a lowest twist rate and the twisted pair communications line having a next largest twist rate carries the (G) color signal.

7. A transmission system as set forth in claim 1 wherein:
  said transmission cable includes a synchronization twisted pair communications line having first and second ends;
  a source of synchronization signals coupled to said first end of said synchronization twisted pair communications line, and said second end of said synchronization twisted pair communications line being couplable to a monitor; and
  said synchronization twisted pair communications line has a highest twist rate of any of said twisted pair communications lines of said transmission cable.

8. A transmission system as set forth in claim 1 including a high frequency video color signal boost circuit for each of said video color signals, each said high frequency video color signal boost circuit being incorporated in a respective said balanced to single-ended circuitry.

9. A transmission system as set forth in claim 8 wherein said high frequency video color signal boost circuit includes a plurality of reactances, each of said plurality of reactances having a time constant for boosting a particular frequency range.

* * * * *